(12) United States Patent
McFarthing

(10) Patent No.: US 9,373,882 B2
(45) Date of Patent: Jun. 21, 2016

(54) NEAR FIELD COMMUNICATION READER WITH VARIABLE POWER SUPPLY

(75) Inventor: Anthony L McFarthing, Ely (GB)

(73) Assignee: Qualcomm Technologies International, Ltd., Cambridge (GB)

( * ) Notice: Subject to any disclaimer, the term of this patent is extended or adjusted under 35 U.S.C. 154(b) by 21 days.

(21) Appl. No.: 13/303,597

(22) Filed: Nov. 23, 2011

(65) Prior Publication Data

US 2013/0112747 A1      May 9, 2013

(30) Foreign Application Priority Data

Nov. 8, 2011   (GB) .................................. 1119246.5

(51) Int. Cl.
*H03J 3/20* (2006.01)
*H03J 7/12* (2006.01)
*H01Q 1/22* (2006.01)
*H04B 5/00* (2006.01)

(52) U.S. Cl.
CPC ................ *H01Q 1/2225* (2013.01); *H03J 3/20* (2013.01); *H03J 7/12* (2013.01); *H04B 5/0031* (2013.01); *H04B 5/0081* (2013.01)

(58) Field of Classification Search
CPC ...................................... H03J 7/12; H03J 3/20
USPC ..................... 235/439, 449; 334/78
See application file for complete search history.

(56) References Cited

U.S. PATENT DOCUMENTS

| | | | | |
|---|---|---|---|---|
| 5,929,716 A * | 7/1999 | Komori | ................... | H03L 7/099 329/325 |
| 6,043,707 A * | 3/2000 | Budnik | ........................... | 330/10 |
| 8,432,224 B1 * | 4/2013 | Woo et al. | ..................... | 330/285 |
| 2005/0285718 A1 | 12/2005 | Enguent | | |
| 2006/0220863 A1 * | 10/2006 | Koyama | ...................... | 340/572.1 |
| 2007/0054629 A1 * | 3/2007 | Maligeorgos et al. | .......... | 455/88 |

(Continued)

FOREIGN PATENT DOCUMENTS

DE   10151856   5/2003
DE   60036319   6/2008

(Continued)

OTHER PUBLICATIONS

"Difference Between RFID and NFC", DifferenceBetween. Oct. 17, 2009. Retrieved from internet on Nov. 4, 2015 from <https://web.archive.org/web/20091017110202/http://www.differencebetween.net/technology/difference-between-rfid-and-nfc/>.*

(Continued)

*Primary Examiner* — Toan Ly
(74) *Attorney, Agent, or Firm* — Mahamedi Paradice LLP

(57) ABSTRACT

The present application relates to a near field communications (NFC) reader which includes an amplifier that drives an antenna. Capacitors of fixed value are connected in series between differential outputs of the amplifier and inputs of the antenna and form a series resonant circuit with the impedance of the antenna. Variable capacitances are provided in series with the fixed value capacitors, and the capacitance of these variable capacitances can be adjusted to compensate for manufacturing tolerances in the fixed value capacitors which cause a frequency offset between a desired resonant frequency of the series resonant circuit its actual resonant frequency, and to compensate for changes in the input impedance of the antenna that occur as the distance between the antenna of the reader and an antenna of an NFC tag changes.

19 Claims, 4 Drawing Sheets

(56) References Cited

U.S. PATENT DOCUMENTS

| | | | |
|---|---|---|---|
| 2007/0096842 A1 | 5/2007 | Hyun | |
| 2007/0200766 A1* | 8/2007 | McKinzie et al. | 343/700 MS |
| 2007/0296593 A1* | 12/2007 | Hall | G06K 19/0723 340/572.7 |
| 2009/0079524 A1* | 3/2009 | Cyr et al. | 334/78 |
| 2009/0174496 A1* | 7/2009 | Van Bezooijen | 333/17.3 |
| 2010/0244944 A1* | 9/2010 | Herzinger | 327/553 |
| 2010/0253442 A1* | 10/2010 | Mu | 333/17.1 |
| 2012/0075019 A1* | 3/2012 | Visser | H03F 1/565 330/196 |
| 2014/0225458 A1* | 8/2014 | Rehm | H04B 5/0037 307/149 |

FOREIGN PATENT DOCUMENTS

| | | |
|---|---|---|
| DE | 102009045186 | 4/2011 |
| EP | 1 837 800 A1 | 9/2007 |
| EP | 1837800 | 9/2007 |
| WO | 03/081802 A1 | 10/2003 |

OTHER PUBLICATIONS

United Kingdom Intellectual Property Office, Combined Search and Examination Report for GB 1119246.5 dated Feb. 27, 2012, 4 pages.

\* cited by examiner

NEAR FIELD COMMUNICATION READER WITH VARIABLE POWER SUPPLY

CROSS-REFERENCE TO RELATED APPLICATIONS

This application claims priority to United Kingdom Patent Application Number GB1119246.5 filed Nov. 8, 2011, entitled "A Near Field Communications Reader," the entire disclosure of which is hereby incorporated by reference, for all purposes, as if fully set forth herein.

TECHNICAL FIELD

The present application relates to a near field communications (NFC) reader.

BACKGROUND TO THE INVENTION

Part of a typical known NFC system is shown schematically at 10 in FIG. 1. In the system of FIG. 1 an NFC reader 12 comprises a power amplifier 14 whose output is connected to input terminals of an antenna 16 by means of an amplifier filter having capacitors 18a, 18b which are connected in series between differential outputs of the power amplifier 14 and input terminals of the antenna 16.

An NFC tag 22 communicates with the reader 12 by means of an antenna 24, with the other components of the tag 22 being represented by a capacitor 26 and a resistor 28 connected in parallel with the antenna 24.

The power amplifier 14 is implemented as part of an integrated circuit (i.e. is an "on-chip" component), whilst the capacitors 18a, 18b are off-chip components (i.e. they are external to the integrated circuit containing the power amplifier 14) of fixed value.

It will be appreciated that the capacitors 18a, 18b and the antenna 16 form a series resonant circuit. The resonant frequency of this circuit is determined at least in part by the capacitance values of the capacitors 18a, 18b. For optimum transmission of data it is important that the resonant frequency of the series resonant circuit is equal to, or at least very close to, the frequency of the signal to be transmitted by the reader 12.

However, the capacitance values of the capacitors 18a, 18b are subject to manufacturing tolerances. These tolerances make it impossible to guarantee that the resonant frequency of the series resonant circuit will be equal to the frequency of the signal to be transmitted, and thus in NFC readers of the type shown in FIG. 1 transmission of data between the reader 12 and the tag 22 is rarely optimum.

This gives rise to two problems. If the signal to be transmitted by the reader 12 is generated by a voltage source the power transfer to the tag 22 may be reduced. If the signal to be transmitted by the reader 12 is generated by a current source the transmitted signal may be distorted if the input impedance of the antenna 16 is too high.

This second problem occurs during NFC operation when the coupling factor between the antenna 16 of the reader 12 and the antenna 24 of the tag 22 changes, and this also produces a change in the resonant frequency of the series resonant circuit and in the equivalent input series resistance of the reader 12. The signal received at the tag may then reach a peak amplitude when the coupling factor has not reached its peak value. Any reduction in the distance between the reader antenna 16 and the tag antenna 24 after this critical coupling point has been reached causes the amplitude of the input signal at the tag 22 to fall.

SUMMARY OF INVENTIONS

The present application relates to a near field communications (NFC) reader which includes an amplifier that drives an antenna. Capacitors of fixed value are connected in series between differential outputs of the amplifier and inputs of the antenna and form a series resonant circuit with the impedance of the antenna. Variable capacitances are provided in series with the fixed value capacitors, and the capacitance of these variable capacitances can be adjusted to compensate for manufacturing tolerances in the fixed value capacitors which cause a frequency offset between a desired resonant frequency of the series resonant circuit its actual resonant frequency. Additionally, the variable capacitances can be adjusted to compensate for changes in the input impedance of the antenna that occur as the distance between the antenna of the reader and an antenna of an NFC tag changes, to optimise the performance of the tag. A further feature enables the power consumption of the reader to be reduced by adjusting the power supply to the amplifier in accordance with a required peak output value.

According to a first aspect of the invention there is provided a near field communications (NFC) reader comprising an amplifier for driving an antenna, the antenna forming part of a resonant circuit, and the NFC reader further comprising a variable capacitance for tuning the resonant circuit to a desired resonant frequency.

The variable capacitance enables the resonant circuit containing the antenna to be precisely tuned to a desired resonant frequency, thereby minimising any frequency offset between the desired resonant frequency (which is typically the frequency of a signal to be transmitted) and the actual resonant frequency of the resonant circuit. Additionally, the variable capacitance, when used in conjunction with an impedance transformer, enables the resonant circuit to be tuned in use of the reader to compensate for variations in the input impedance of the antenna which may occur as a distance between the antenna of the reader and an antenna of a tag changes, allowing the performance of the tag to be optimised. Tuning of the resonant circuit to optimise performance in this way also has advantages in terms of the power efficiency of the reader. If the reader is a current source and delivers a current to the antenna then minimising the antenna input voltage by reducing the antenna input impedance allows the amplifier supply voltage to be reduced, thereby reducing the overall power consumption of the reader. If the reader is a voltage source then minimising the antenna impedance allows maximum power transfer to the tag. An additional benefit off tuning is that it reduces ringing or overshoot on data edges thereby enabling a lower probability of data corruption while a reader and tag are communicating.

The near field communications reader may further comprise a control circuit configured to detect a frequency offset between the desired resonant frequency and the actual resonant frequency of the resonant circuit, and to adjust the variable capacitance to tune the resonant circuit to the desired resonant frequency.

The control circuit may comprise a phase detector for detecting the phase of a signal at an input of the antenna.

The near field communications reader may further comprise a power supply for powering the amplifier, the control circuit being operative to control the voltage output by the power supply. The power supply voltage can be set to be as low as possible whilst still just permitting the required voltage and/or current to be supplied to the antenna.

For example, the control circuit may be configured to detect the peak amplitude of a signal at an input of the antenna and to adjust the voltage output by the power supply to a minimum level at which the detected peak amplitude of the signal can be provided by the amplifier.

The amplifier and the variable capacitance may be implemented as part of an integrated circuit.

The variable capacitance may comprise a capacitive digital to analogue converter for example.

The near field communications reader may further comprise an impedance transformer for matching the input impedance of the antenna to the output impedance of the amplifier. This helps to maintain a low antenna input impedance.

BRIEF DESCRIPTION OF THE DRAWINGS

Embodiments of the invention will now be described, strictly by way of example only, with reference to the accompanying drawings, of which

DESCRIPTION OF THE EMBODIMENTS

Figure 1:
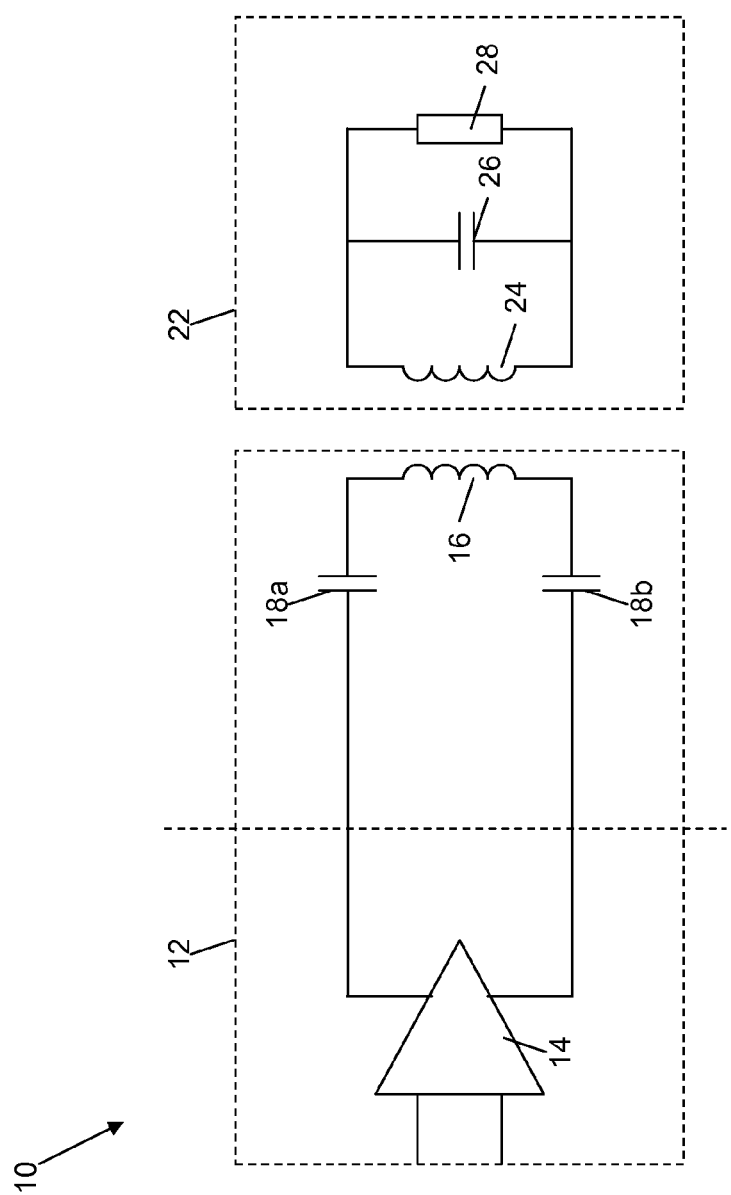
FIG. 1 is a schematic representation of a known NFC reader and tag.
Figure 2:
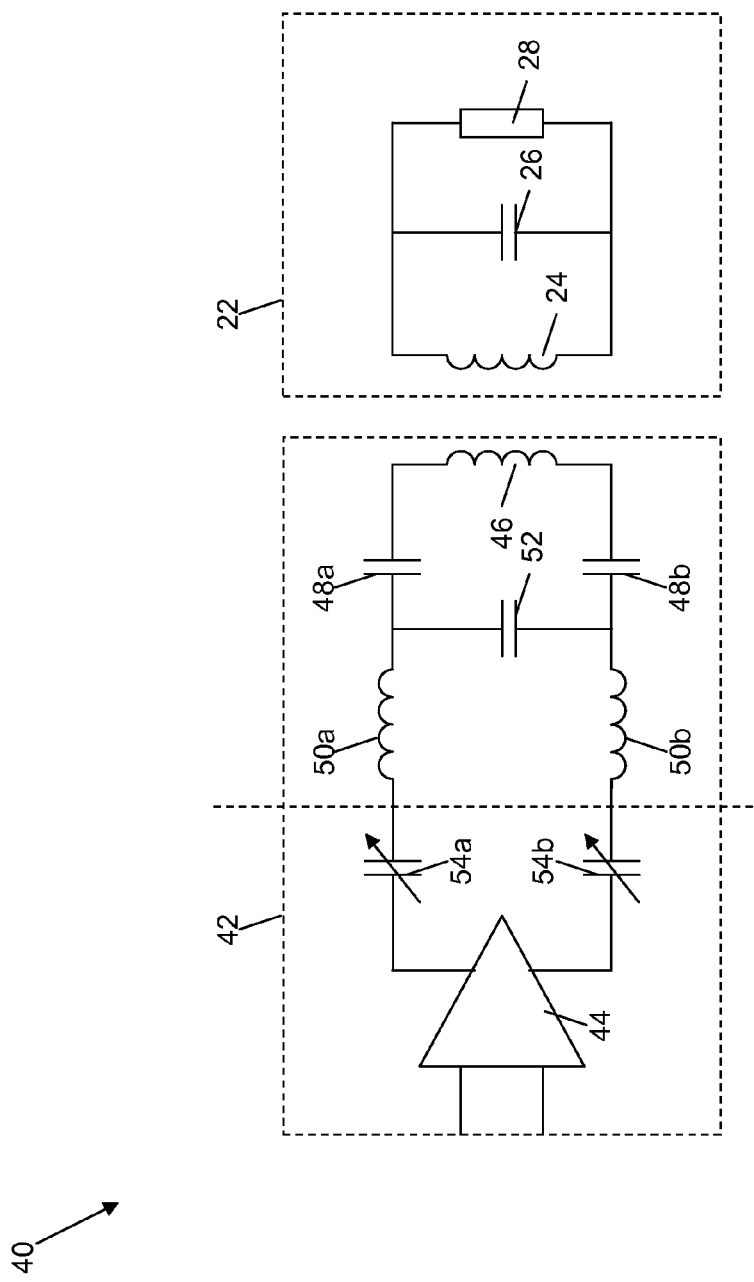
FIG. 2 is a schematic representation of an NFC system which uses an NFC reader according to one embodiment of the present invention.

Referring now to FIG. 2, an NFC system is shown generally at 40, and comprises an NFC reader 42 which communicates with a tag 22. The tag 22 is identical in structure and function to the tag 22 illustrated in FIG. 1, and thus will not be described again here.

The NFC reader 42 comprises a power amplifier 44 whose output is connected to input terminals of an antenna 46 by means of an antenna filter. The antenna filter includes capacitors 48a, 48b, which are connected in series between differential outputs of the power amplifier 44 and the input terminals of the antenna 46. Thus, the capacitors 48a, 48b of the antenna filter and the inductance of the antenna 44 form a series resonant circuit.

The NFC reader 42 also includes inductors 50a, 50b which are connected in series between the differential outputs of the power amplifier 44 and the capacitors 48a, 48b, and a further capacitor 52 which is connected in parallel with the antenna 46. The capacitors 48a, 48b, 52 and the inductors 50a, 50b are off-chip components, whilst the power amplifier 44 is an on-chip component. The dashed line in FIG. 2 represents the border between on-chip and off-chip components.

The purpose of the series inductors 50a, 50b and the parallel capacitor 52 is to transform the input impedance of the antenna 46, so that the input impedance of the antenna 46, as "seen" by the output of the amplifier 44, is minimised, allowing maximum drive current to the antenna 46, for maximum power transfer between the output of the amplifier 44 and the tag 22. These impedance transformation components have a negligible effect on the input impedance of the antenna 46 when the coupling between the antenna 46 of the reader 42 and the antenna 24 of the tag 22 is low, but at higher coupling values the input impedance of the antenna 46 is greatly reduced, which is useful for maintaining current drive levels of the signal to be transmitted at high coupling values. The series inductors 50a, 50b and the parallel capacitor 52 also form a low-pass filter that helps to reduce any high frequency interference generated by the NFC reader 42, which helps in meeting requirements for coexistence of the reader 42 with other devices.

The NFC reader 42 also includes variable capacitances 54a, 54b which are connected in series between the differential outputs of the amplifier 44 and the series inductors 50a, 50b. In the embodiment illustrated in FIG. 2 the variable capacitances are on-chip components, and may be implemented, for example, by one or more on-chip capacitive digital-to-analogue converters (CDACs), but it will be appreciated that the variable capacitances 54a, 54b may be implemented in other ways, either as on-chip components or as off-chip components.

The capacitance values of the variable capacitances 54a, 54b are adjustable to adjust the resonant frequency of series resonant circuit formed by the capacitors 48a, 48b of the antenna filter and the inductance of the antenna 46 to compensate for differences between the capacitance values of the capacitors 48a, 48b and their nominal values due to manufacturing tolerances, thus allowing a desired optimum resonant frequency to be achieved in the series resonant circuit. This adjustment of the capacitance values of the variable capacitances 54a, 54b may be performed, for example, during a calibration stage during a manufacturing process of the NFC reader 42, or may be performed dynamically in use of the reader 42, as will now be explained.

Figure 3:
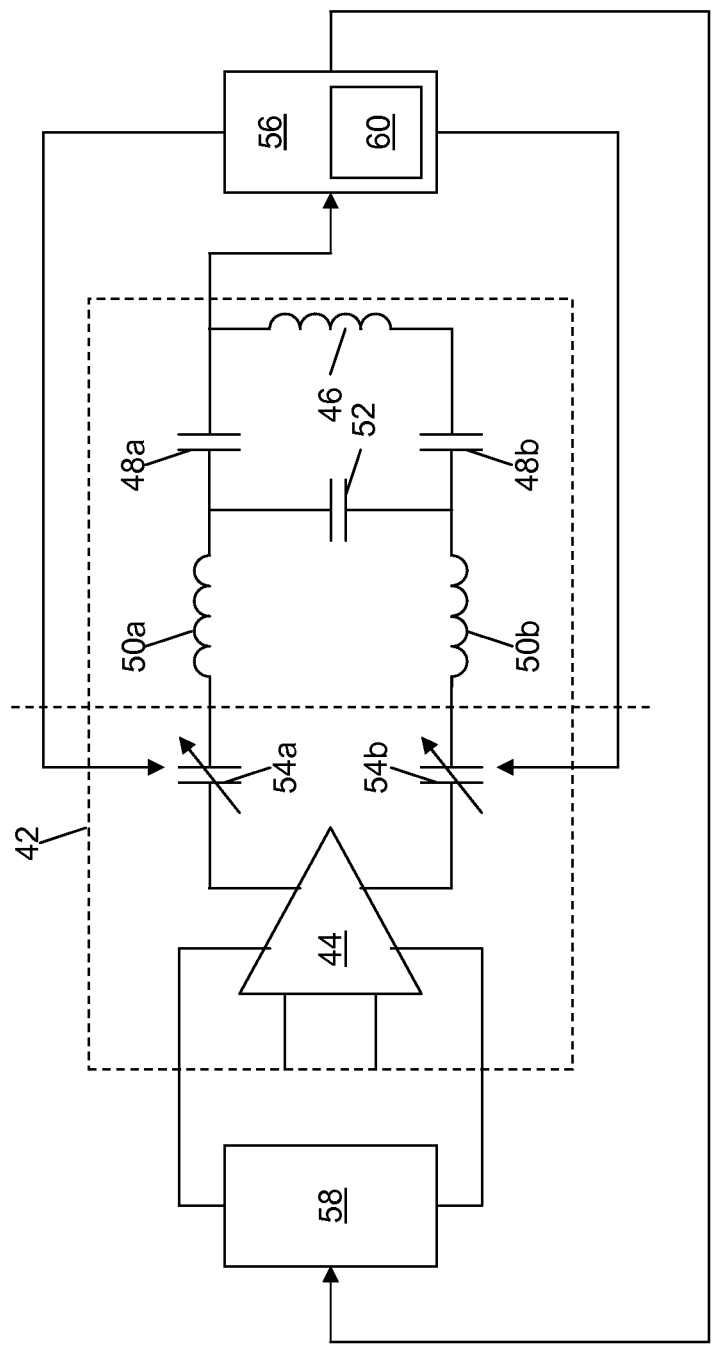
FIG. 3 is a schematic representation of the NFC reader shown in FIG. 2.

As can be seen from FIG. 3, the NFC reader 42 includes a control circuit 56 which, in this embodiment, has an input connected to an input of the reader antenna 46. The control circuit 56 has two outputs which control the capacitance of the variable capacitances 54a, 54b, and a further output which controls the operation of a switch mode power supply (SMPS) 58. The control circuit 56 may be part of a receiving section of the NFC reader 42 (e.g. the control circuit may include or be part of a quadrature receiver, level detector or the like), or may be a dedicated control circuit for controlling the variable capacitances 54a, 54b and the SMPS 58.

The control circuit 56 receives at its input a signal which represents the signal input to the reader antenna 46. For example, the input of the control circuit 56 may be directly connected to an input of the reader antenna 56.

To calibrate the reader 42 by adjusting the variable capacitances 54a, 54b to compensate for the manufacturing tolerances of the fixed value capacitors 48a, 48b a known reference signal maybe input to the amplifier 44. The control circuit 56 detects any offset between the desired resonant frequency of the series resonant circuit and its actual resonant frequency, and outputs a signal to the variable capacitances 54a, 54b to adjust their capacitance values until the actual resonant frequency of the series resonant circuit is equal to the desired resonant frequency. This calibration process can be repeated periodically by the reader 42 to compensate for changes in the resonant frequency of the series resonant circuit due to age, temperature differences and the like.

The capacitance of the variable capacitances 54a, 54b can also be adjusted to optimise the performance of the tag 22 as the coupling between the antenna 24 of the tag and the antenna 46 of the reader 42 changes due to changes in the distance between the tag 22 and the reader 42, as will be explained below.

As the distance between the reader antenna 46 and the tag antenna 24 changes, the coupling between the two antennas also changes. The coupling coefficient between the reader antenna 46 and the tag antenna 22 is inversely proportional to the distance between the antennas 46, 22, such that as the distance between the antennas 46, 22 increases, the coupling coefficient decreases. As the coupling coefficient changes, the real and imaginary parts of the impedance (i.e. the resistance and the reactance) of the reader antenna 46 change, and this change in the impedance of the reader antenna 46 alters the series resonant frequency of the series resonant circuit containing the antenna 46, which can reduce the amplitude of the signal received at the tag antenna 24, as described above.

A change in the impedance of the reader antenna 46 causes a corresponding change in the phase of the signal at the input of the antenna 46. The control circuit 56 includes a phase detector 60 which is configured to detect the phase of the signal at the input of the reader antenna 46 and to output a signal to adjust the capacitance values of the variable capacitances 54a, 54b to reduce the change in the phase of the signal at the input of the reader antenna 46. This change in the capacitance of the variable capacitances 54a, 54b compensates for the change in the impedance of the antenna 46 resulting from a change in the coupling between the reader antenna 46 and the tag antenna 24.

As the control circuit 56 receives at its input a signal representing the signal at the input of the antenna 46, the control circuit 56 is able to dynamically adjust the capacitance of the variable capacitances 54a, 54b to optimise data transmission between the reader 42 and the tag 22 as the distance between the reader 42 and the tag 22, and thus the coupling between the reader antenna 46 and the tag antenna 24, changes. For example, optimum data transmission may occur when the phase of the signal at the input of the reader antenna 46 is zero degrees. As the distance between the reader 42 and the tag 22 increases the phase of this input signal changes, but the control circuit 56 is able to detect this phase change and adjust the capacitance values of the variable capacitances 54a, 54b to bring the phase of the input signal back towards zero degrees, thereby improving data transmission between the reader 42 and the tag 22.

The reader architecture illustrated in FIG. 3 can also be used to improve the power efficiency of the reader 42. Tuning the series resonant circuit containing the reader antenna 46 to the frequency of the signal to be transmitted by adjusting the capacitance of the variable capacitances 54a, 54b allows the supply voltage of the amplifier 44 to be reduced. This is because when the series resonant circuit is tuned in this way a larger proportion of the power of the output signal is transmitted to the tag antenna 24 than when there is a frequency offset between the resonant frequency of the series resonant circuit and the frequency of the signal to be transmitted. Thus acceptable signal reception can be achieved at the tag 22 with lower transmit signal power, i.e. the amplitude of the signal output by the amplifier 44 to the antenna 46 can be reduced, and thus the supply voltage required by the amplifier 44 is reduced. Thus, adjusting the capacitance of the variable capacitances 54a, 54b to tune the series resonant circuit containing the antenna 46 in this way enables the supply voltage to the amplifier 44 to be reduced to a minimum, that is to say a level that is slightly higher than the peak input voltage to the antenna 46, to allow the amplifier 44 to supply the required peak output voltage without a significant voltage overhead, thereby reducing the overall power consumption of the reader 42.

The supply voltage to the amplifier 44 can be adjusted dynamically to meet changing conditions such as changes in the coupling between the reader antenna 46 and the tag antenna 24, to improve the power efficiency of the reader 46. The amplifier 44 is powered by the switch mode power supply (SMPS) 58, which is controlled by the control circuit 56.

As is explained above, phase detector 60 of the control circuit 56 detects the phase of the signal at the input of the antenna 46 and the control circuit 56 adjusts the capacitance of the variable capacitances 54a, 54b to compensate for tolerances in the values of the fixed value capacitors 48, 48b and changes in the coupling between the reader antenna 46 and the tag antenna 24.

When the required adjustment of the capacitance of the variable capacitances 54a, 54b to has been achieved, the supply voltage to the amplifier 44 may be reduced to improve the power efficiency of the reader 42, as will be explained below.

The control circuit 56 is configured to detect the amplitude of the signal at the input of the antenna 46, for example using a level detector, and to compare the detected amplitude of the signal at the input of the antenna 46 to the supply voltage to the amplifier 44 provided by the SMPS 58. In the case where the amplifier 44 acts as a voltage source to drive the antenna 46 this comparison may be a simple comparison of the peak voltage at the input of the antenna 46.

If there is a large difference between the detected peak amplitude of the signal at the input of the antenna 46 the control circuit transmits a signal to the SMPS 58 to cause the SMPS 58 to reduce its duty cycle, thereby reducing the supply voltage to the amplifier 44. In this way the supply voltage to the amplifier 44 can be reduced to a level just above the peak value of the signal at the input of the antenna 46, when the series resonant circuit containing the capacitors 48a, 48b and the antenna 46 has been tuned to the desired resonant frequency, to reduce the power consumption of the reader 42.

It will be appreciated that the process of adjusting the capacitance of the variable capacitances 54a, 54b is not instantaneous, and while this compensation is taking place it may be necessary to increase the power of the transmitted signal by increasing the voltage of the signal output by the amplifier 44, which may in turn require an increase in the supply voltage to the amplifier 44. In such circumstances the control circuit 56 can output a signal to the SMPS 58 to cause the SMPS to increase its duty cycle, thereby increasing the supply voltage to the amplifier 44.

Figure 4:
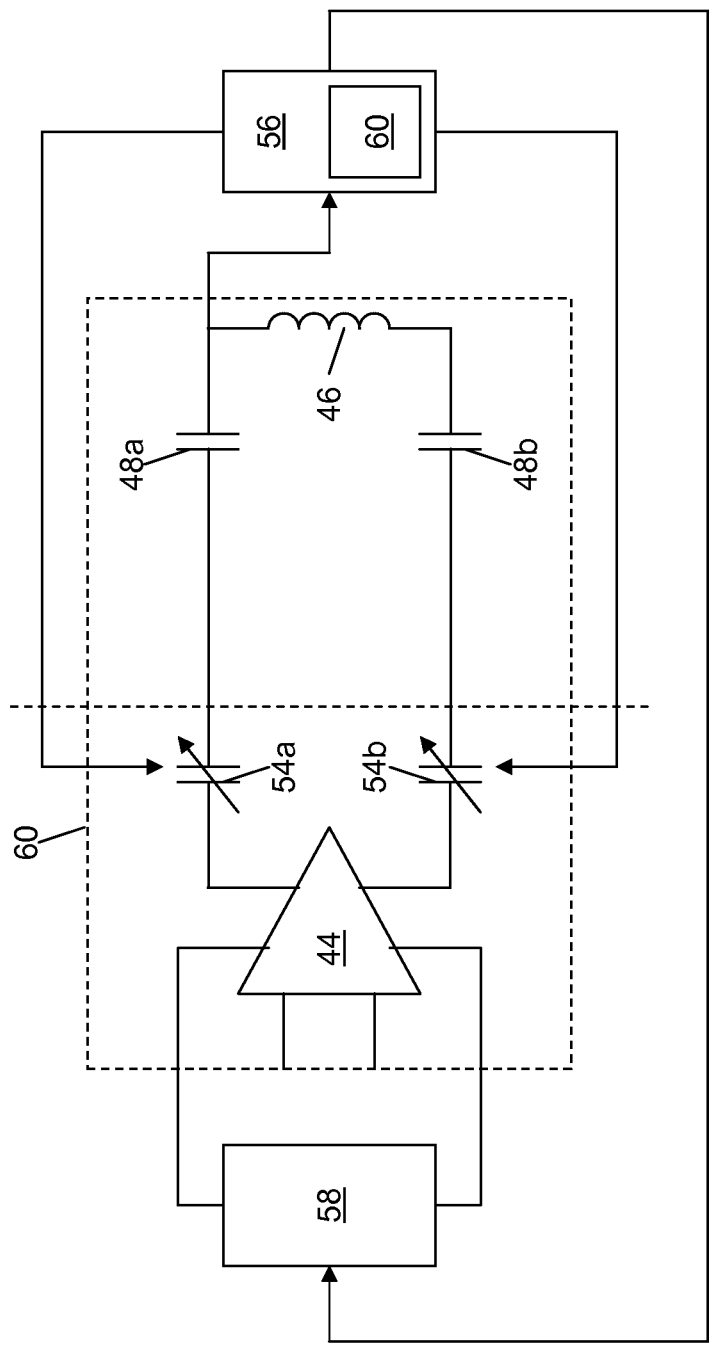
FIG. 4 is a schematic representation of an alternative embodiment of an NFC reader.

FIG. 4 is a schematic diagram in which of showing an alternative embodiment of an NFC reader is shown generally at 70. The NFC reader 80 of FIG. 5 includes many of the same components as the reader 42 illustrated in FIG. 3, and so the same reference numerals have been used to denote the components that are common to the embodiments illustrated in FIGS. 3 and 5.

The NFC reader 80 of FIG 4 operates in the same way as the reader 42 described above in relation to FIG. 3, and thus offers the advantages of improved data transmission between the reader 80 and a tag 22 described above. However, the reader 80 of FIG. 4 differs from the reader 42 of FIG. 3 in that the series inductors 50a,50b and the parallel capacitor 52 that are used in the reader 42 of FIG. 3 for impedance transformation are omitted from the reader 80 of FIG. 4. This simplifies the reader 80, but the reader 80 of FIG. 4 does not benefit from the impedance transformation and low pass filtering associated with the series inductors 50a, 50b and the parallel capacitor 52 of the reader 42 of FIG. 3, and does not perform as well when the coupling factor approaches values close to unity, which is the usual operating range for passive tags. The embodiment illustrated in FIGS. 2 and 3 show a particularly effective arrangement for power transfer and data throughput between the reader 42 and the tag 22 for the full range of antenna coupling.

What is claimed is:
1. A near field communications (NFC) reader comprising:
   a series resonant circuit including an antenna;
   an amplifier configured to drive the antenna;

a first variable capacitance connected in series between a first differential output of the amplifier and a first terminal of the antenna;

a second variable capacitance connected in series between a second differential output of the amplifier and a second terminal of the antenna, the first and second variable capacitances configured to tune the resonant circuit to a desired resonant frequency to compensate for a change in an impedance of the antenna resulting from a change in coupling between the antenna and an antenna of a tag with which the NFC reader is communicating;

a power supply including an output coupled to a power supply input of the amplifier, and a control circuit configured to control a voltage supplied by the power supply to the power supply input of the amplifier.

2. The near field communications reader of claim 1, the control circuit configured to detect a frequency offset between the desired resonant frequency and an actual resonant frequency of the resonant circuit.

3. The near field communications reader of claim 2, wherein the control circuit comprises a phase detector configured to detect a phase of a signal at an input of the antenna.

4. The near field communications reader of claim 3, wherein the phase detector is further configured to reduce a change in phase of an antenna input signal by adjusting at least one of the first variable capacitance and the second variable capacitance.

5. The near field communications reader of claim 2, wherein the control circuit is further configured to tune the resonant circuit to the desired resonant frequency by adjusting at least one of the first variable capacitance and the second variable capacitance.

6. The near field communications reader of claim 1, wherein the control circuit is configured to detect a peak amplitude of a signal at an input of the antenna and to adjust the output voltage of the power supply to a minimum level at which the amplifier is able to provide an output signal with the detected peak amplitude.

7. The near field communications reader of claim 1, wherein the amplifier and the first and second variable capacitances are implemented as part of an integrated circuit.

8. The near field communications reader of claim 1, wherein each of the first and second variable capacitances comprises a capacitive digital to analog converter.

9. The near field communications reader of claim 1, further comprising an impedance transformer configured to match the impedance of the antenna to an output impedance of the amplifier.

10. A near field communications (NFC) reader, comprising:

an antenna including a first terminal and a second terminal, the antenna forming part of a resonant circuit;

an amplifier including a first differential output terminal and a second differential output terminal;

a first variable capacitor and a first inductor coupled in series between the first differential output terminal of the amplifier and the first terminal of the antenna;

a second variable capacitor and a second inductor coupled in series between the second differential output terminal of the amplifier and the second terminal of the antenna; and a controller, coupled to the first and second variable capacitors, configured to compensate for a change in an impedance of the antenna resulting from a change in coupling between the antenna and an antenna of a tag with which the NFC reader is communicating.

11. The near field communications reader of claim 10, wherein the controller is configured to compensate for the change by adjusting capacitances of the first and second variable capacitors.

12. The near field communications reader of claim 11, wherein the controller is further configured to detect a frequency offset between a desired resonant frequency and an actual resonant frequency of the resonant circuit.

13. The near field communications reader of claim 12, wherein the controller is further configured to tune the resonant circuit to the desired resonant frequency by adjusting at least one of the first and the second capacitances.

14. The near field communications reader of claim 12, wherein the controller further comprises a phase detector configured to detect a phase of a signal at an input of the antenna.

15. The near field communications reader of claim 14, wherein the phase detector is configured to reduce a change in the phase of the signal at the input of the antenna by adjusting the respective first and second capacitances.

16. The near field communications reader of claim 10, wherein the controller is further configured to:

determine a difference between a peak voltage of a signal at an input of the antenna and an amplifier supply voltage; and decrease the amplifier supply voltage in response to determining that the difference between the peak voltage and the amplifier supply voltage exceeds a value.

17. The near field communications reader of claim 10, wherein the controller is further configured to decrease an amplifier supply voltage in response to adjusting capacitances of the first and second variable capacitors.

18. The near field communications reader of claim 10, wherein the controller is further configured to compensate for the change in the impedance of the antenna by periodically adjusting capacitances of the first and second variable capacitors.

19. The near field communications reader of claim 10, wherein the controller is further configured to temporarily increase an amplifier supply voltage while compensating for the change in the impedance of the antenna.

* * * * *